United States Patent
Jeong et al.

(10) Patent No.: US 7,132,358 B2
(45) Date of Patent: Nov. 7, 2006

(54) METHOD OF FORMING SOLDER BUMP WITH REDUCED SURFACE DEFECTS

(75) Inventors: Se-Young Jeong, Seoul (KR); Jin-Hak Choi, Suwon-si (KR); Nam-Seog Kim, Yongin-si (KR); Kang-Wook Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 10/922,172

(22) Filed: Aug. 20, 2004

(65) Prior Publication Data

US 2005/0164483 A1 Jul. 28, 2005

(30) Foreign Application Priority Data

Aug. 21, 2003 (KR) .................. 10-2003-0058003

(51) Int. Cl.
*H01L 21/44* (2006.01)
(52) U.S. Cl. .................. 438/614; 438/577; 438/951; 257/E27.44
(58) Field of Classification Search .......... 438/614, 438/577, 951
See application file for complete search history.

(56) References Cited

U.S. PATENT DOCUMENTS 3,700,497 A * 10/1972 Epifano et al. ............ 438/614
5,310,669 A * 5/1994 Richmond et al. .......... 435/177
5,888,892 A * 3/1999 Yanagida .................... 438/614
6,372,545 B1 4/2002 Fan et al.

FOREIGN PATENT DOCUMENTS

JP 11-317418 11/1999

* cited by examiner

*Primary Examiner*—Michael Lebentritt
*Assistant Examiner*—Ron Pompey
(74) *Attorney, Agent, or Firm*—Harness, Dickey & Pierce, P.L.C.

(57) ABSTRACT

A method of forming a solder bump may involve forming a first photoresist pattern on a wafer having a pad. The first photoresist pattern may have an opening that exposes a portion of the pad. A first under bump metallurgy (UBM) layer may be formed on the pad, and a second UBM layer may be formed on the first photoresist pattern. A second photoresist pattern may be formed that exposes the first UBM layer and covers the second UBM layer. A solder bump may be formed in the opening. The second photoresist pattern and the first photoresist pattern may be removed using a stripper, thereby removing the second UBM layer by a lift-off method.

15 Claims, 8 Drawing Sheets

METHOD OF FORMING SOLDER BUMP WITH REDUCED SURFACE DEFECTS

This application claims priority under 35 U.S.C. §119 to Korean Patent Application No. 2003-58003, filed on Aug. 21, 2003, in the Korean Intellectual Property Office, the disclosure of which is incorporated herein in its entirety by reference.

BACKGROUND OF THE INVENTION

1. Field of the Invention

The present invention relates generally to a method of forming a flip chip solder bump that may be used for connecting flip chips of semiconductor goods, and more particularly, to a method of forming the flip chip solder bump without defects on a surface of a wafer or the solder bump.

2. Description of the Related Art

Three methods of connecting a chip to a carrier are wire bonding, tape automated bonding (TAB), and using a flip chip connection. Solder bumps may be formed on a wafer or the carrier to electrically connect the chip to the carrier using the TAB and the flip chip connection methods.

According to conventional wisdom, an under bump metallurgy (UBM) layer may be formed by sputtering and a solder bump may be formed by electroplating. When these conventional methods are implemented, a photoresist pattern may be removed by a stripper and the UBM layer may be etched after forming the solder bump by electroplating.

FIGS. 1 through 4 are cross-sectional views illustrating a conventional method of manufacturing a solder bump. Referring to FIG. 1, a passivation layer 5 may be formed on a wafer 1 having a pad 3. The passivation layer 5 may be formed so that a portion of the pad 3 may remain exposed. A polyimide 7 may be formed on the passivation layer 5, leaving a portion of the passivation layer 5 exposed near the exposed pad 3.

A shown in FIG. 2, a UBM layer 9 may be formed by sputtering on an upper portion of the structure depicted in FIG. 1, and a photoresist pattern 11 may be formed on the UBM layer 9. The photoresist pattern 11 may be provided with an opening 10 that exposes a portion of the UBM layer 9 above the pad 3.

Referring to FIGS. 3 and 4, a solder bump 13 may be formed by filling the opening 10 with a solder material by electroplating. The photoresist pattern 11 may be removed by a stripper, and the UBM layer 9 may be etched until a UBM layer 9a only remains under the solder bump 13.

A chemical etchant containing an acid such as nitric acid, sulphuric acid, or hydrofluoric acid (for example) may be used in the etching process of the UBM layer 9. However, the chemical etchant may cause several problems. First, a surface defect may occur on a wafer since UBM residue may remain after the etching process. As illustrated in FIG. 5, UBM residue 15 may cause an electrical short between adjacent solder bumps 13. Second, a surface defect may occur on the solder bump 13 itself. The surface defect may occur if the etchant for removing the UBM layer 9 reacts with the solder bump 13, thereby forming an oxide (e.g., a PbO crystal) on the surface of the solder bump 13. The formed oxide may weaken an adhesive strength of a connection between the solder bump 13 and a printed circuit board (PCB). Third, the oxide on the surface of the solder bump 13 may cause solder residue to remain on unintended portions of the wafer surface after a solder bump reflow process.

The shortcomings associated with conventional solder bump forming techniques may stem from the etchant used when etching the UBM layer.

SUMMARY OF THE INVENTION

Exemplary embodiments of the present invention provide a method of forming a solder bump in which a decline in bump quality and/or a decline in yield due to under bump metallurgy (UBM) residue, a bump surface attack, and/or solder residue (for example) may be reduced.

The UBM layer may be removed without using an UBM layer etchant, which may be a direct cause of a defect. Alternatively, a UBM layer etchant may be used. In this case, the etching process may be performed before the solder bump is formed.

According to an exemplary embodiment of the present invention, a method of forming a solder bump may involve forming a first photoresist pattern on a wafer having a pad. The first photoresist pattern may have an opening that exposes a portion of the pad. A first under bump metallurgy (UBM) layer may be formed on the pad, and a second UBM layer may be formed on the first photoresist pattern. A second photoresist pattern may be formed that exposes the first UBM layer and covers the second UBM layer. A solder bump may be formed in the opening. The second photoresist pattern and the first photoresist pattern may be removed using a stripper, thereby removing the second UBM layer by a lift-off method.

According to another exemplary embodiment of the present invention, a method of forming a solder bump may involve forming a passivation layer on a wafer having a pad. The passivation layer may expose a portion of the pad. A first photoresist pattern may be formed on the passivation layer having an opening to expose the pad. A first under bump metallurgy (UBM) layer may be formed on the pad, and a second UBM layer may be formed on the first photoresist pattern. A second photoresist pattern may be formed that exposes the first UBM layer and covers the second UBM layer. A groove may be formed by removing a portion of the second photoresist pattern, the second UBM layer, and the first photoresist pattern. A solder bump may be formed in the opening. A stripper may be applied in the groove to remove the second photoresist pattern and the first photoresist pattern, thereby removing the second UBM layer by a lift-off method.

According to another exemplary embodiment of the present invention, a method of forming a solder bumpmay involve forming a passivation layer on a wafer having a pad. The passivation layer may expose a portion of the pad. A first photoresist pattern may be formed on the passivation layer. The first photoresist pattern may have a first opening that exposes the pad. A first under bump metallurgy (UBM) layer may be formed on the pad, and a second UBM layer may be formed on the first photoresist pattern. A photoresist layer may be formed over the first and the second UBM layers. A groove may be formed in the photoresist layer so as to expose the second UBM layer by exposing and developing the photoresist layer. The second UBM layer exposed by the groove may be etched. A second photoresist pattern may be formed by re-exposing and re-developing the photoresist layer disposed on the first UBM layer to form a second opening that extends from the first opening. A solder bump may be formed in the opening. A stripper may be applied into the groove to remove the second photoresist pattern and the first photoresist pattern, thereby removing the second UBM layer by a lift-off method.

According to another exemplary embodiment, a method of forming a solder bump may involve forming a solder bump in an opening extending through a first photoresist pattern provided on a wafer, an under bump metallurgy (UBM) layer provided on the first photoresist pattern, and a second photoresist pattern provided on the UBM layer. A groove may be formed that extends through the second photoresist pattern and the UBM layer. A stripper may be applied in the groove to remove the second photoresist pattern and the first photoresist pattern, thereby removing the UBM layer by a lift-off method. The groove may be spaced apart from the opening. The groove may surround the opening.

According to another exemplary embodiment, a method of forming a solder bump may involve a) forming a solder bump in an opening extending through a first photoresist pattern provided on a wafer, an under bump metallurgy (UBM) layer provided on the first photoresist pattern, and a second photoresist pattern provided on the UBM layer, and b) applying a stripper to remove the second photoresist pattern and the first photoresist pattern, thereby removing the UBM layer by a lift-off method. In an example embodiment, a) and b) may be performed in sequential order.

BRIEF DESCRIPTION OF THE DRAWINGS

The present invention will become more apparent from the description of the exemplary embodiments that follows, with reference to the attached drawings.

Figure 1:
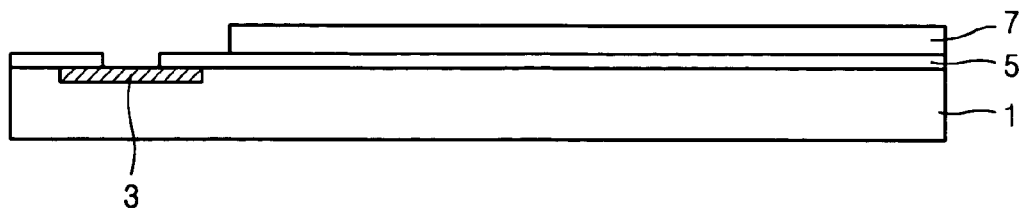
FIGS. 1 through 4 are cross-sectional views illustrating a conventional method that may be implemented for manufacturing a solder bump.
Figure 2:
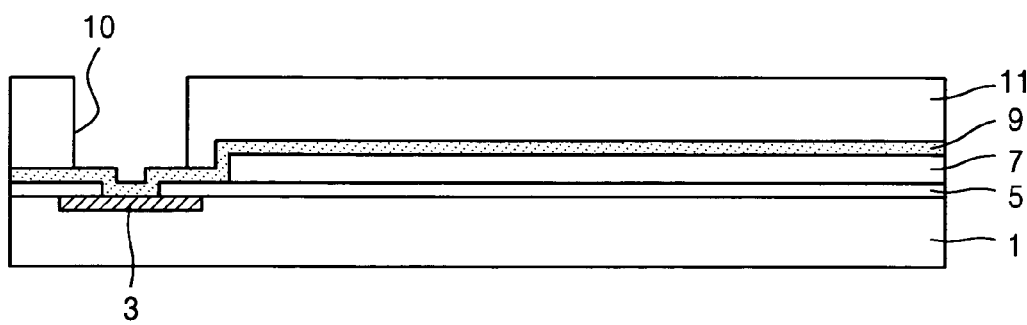
Figure 3:
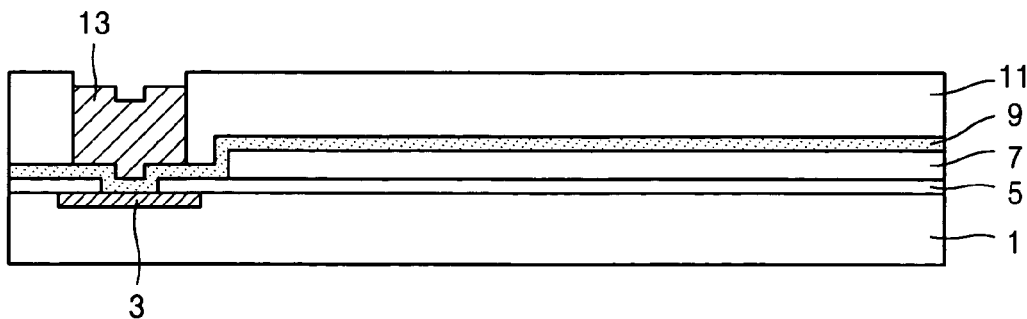
Figure 4:
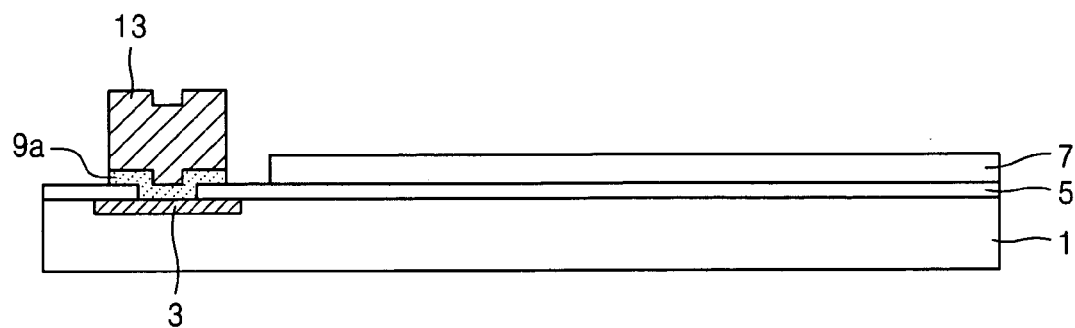
Figure 5:
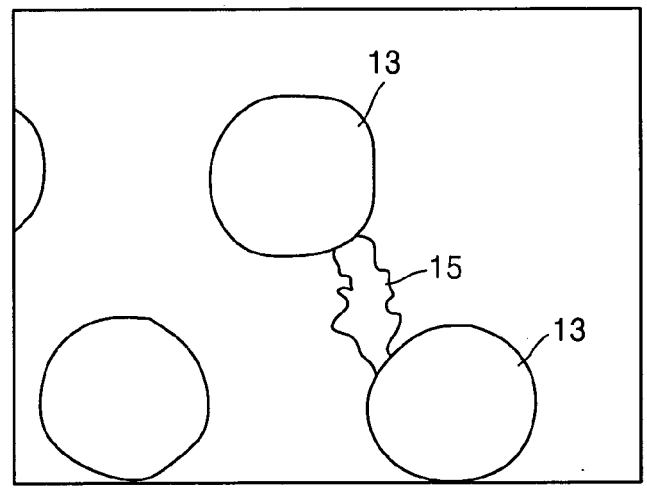
FIG. 5 is a schematic view of a surface defect of a wafer formed in a conventional solder bump manufacturing method.

It will be understood that exemplary embodiments of the present invention described herein can be modified in form and detail without departing from the spirit and scope of the invention. Accordingly, the exemplary embodiments described herein are provided by way of example and not of limitation, and the scope of the present invention is not restricted to the particular embodiments described herein. For example, a layer is considered as being formed "on" another layer or a substrate when formed either directly on the referenced layer or the substrate or formed on other layers or patterns overlaying the referenced layer.

DETAILED DESCRIPTION OF EXEMPLARY EMBODIMENTS OF THE INVENTION

Exemplary embodiments of the present invention will now be described more fully with reference to the attached drawings. This invention may, however, be embodied in many different forms and should not be construed as being limited to the embodiments set forth herein. Rather, these embodiments are provided so that this disclosure will be thorough and complete, and will fully convey the concept of the invention to those skilled in the art.

It is to be appreciated that the figures are not drawn to scale. Rather, for simplicity and clarity of illustration, the dimensions of some of the elements are exaggerated relative to other elements. Identical reference numerals are used for like elements throughout the figures.

The present invention may be applied to a semiconductor chip (e.g., a silicon wafer) and/or to a carrier (e.g., a substrate such as a silicon wafer or an alumina plate) to which the semiconductor chip may be attached. That is, when connecting the semiconductor chip and the carrier with a solder bump interposed therebetween, the solder bump may be formed on the semiconductor chip or the carrier. In the exemplary embodiments described below, the solder bump may be formed on the silicon wafer. It will be apparent to those skilled in the art, however, that the solder bump may be formed on the carrier.

FIGS. 6 through 11 are cross-sectional views illustrating a method of manufacturing a solder bump according to an exemplary, non-limiting embodiment of the present invention.

Figure 6:
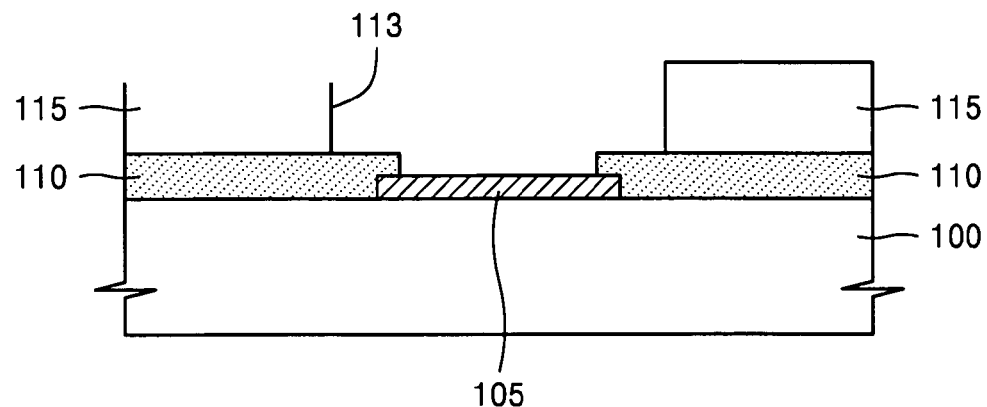
FIGS. 6 through 11 are cross-sectional views illustrating a method of manufacturing a solder bump according to an exemplary, non-limiting embodiment of the present invention.

As illustrated in FIG. 6, a passivation layer 110 may be formed on a wafer 100 by spin coating or some other suitable technique, as is well known in this art. The passivation layer 10 may be formed so as to expose a portion of a pad 105 provided on the wafer 100. The passivation layer 110 may be formed of a polyetherimide, an epoxy, a silicon resin, or some other suitable material, as is well known in this art. The wafer 100 may be covered by a passivation layer formed of a silicon nitride layer or an oxide layer, or some other suitable material, and may be fab-out. Thus, a second passivation layer made of the silicon nitride or silicon oxide may be formed between the wafer 100 and the passivation layer 110. The pad 105 may be fabricated from Al, Cu, or some other suitable material, as is well known in this art.

A first photoresist pattern 115 may be formed on the passivation layer 110. The first photoresist pattern 115 may be provided with an opening 113 that exposes the pad 105 and a portion of the passivation layer 110 in the vicinity of the pad 105. The first photoresist pattern 115 may be formed by providing a photoresist layer on the passivation layer 110 and exposing and developing the photoresist layer with a mask. The first photoresist pattern 115 may be used to form a solder bump. In addition, the first photoresist pattern 115 may be used to remove an under bump metallurgy (UBM) layer via a lift-off method. To facilitate the lift-off method, the first photoresist pattern 115 may be thicker than the UBM layer, which typically has a thickness of 0.5~1 µm.

Figure 7:
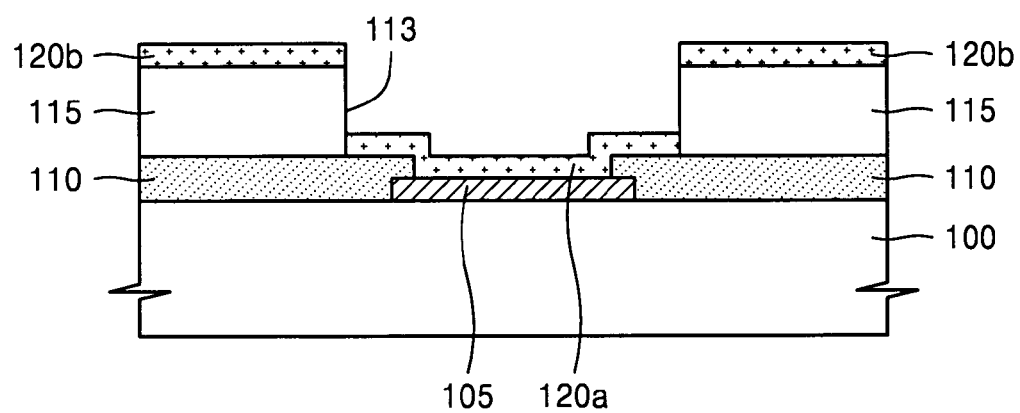
Figure 8:
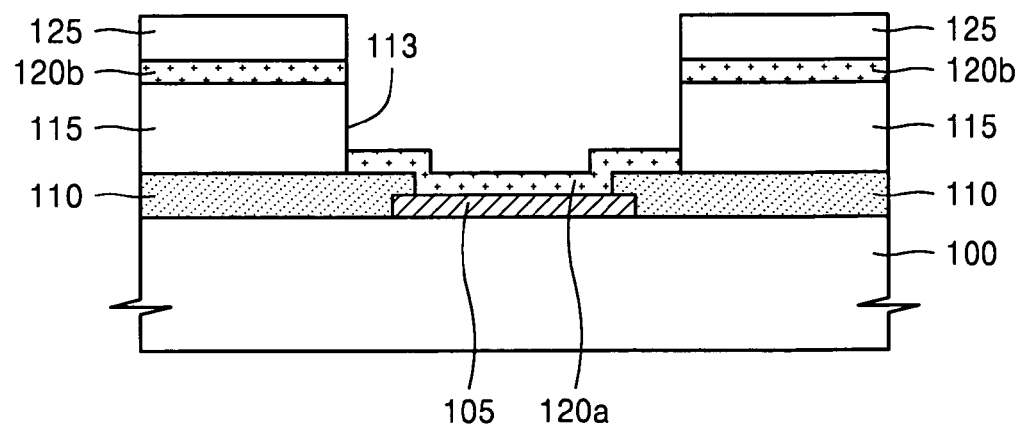

Referring to FIG. 7, a first UBM layer 120a and a second UBM layer 120b may be respectively formed inside and outside of the opening 113 by sputtering or some other technique, as is well known in this art. The first UBM layer 120a may be used to form the solder bump. The first UBM layer 120a may face sidewalls of the first photoresist pattern 115 and side surfaces of the passivation layer 110. The first UBM layer 120a may cover an upper surface of the passivation layer 110 and an upper surface of the pad 105. The second UBM layer 120b may be formed on the first photoresist pattern 115. The second UBM layer 120b may be removed by the lift-off method described below.

The first UBM layer 120a may increase an adhesive strength between the pad 105 and the solder bump that may be formed in a subsequent process, and thus the first UBM layer 120a may be formed of a suitable material for the pad 105 and the solder bump. For instance, and by way of example only, if the solder bump includes Pb—Sn, or a Pb—Sn family including In, Ag, or Bi, and if the pad 105 is formed of Al or Cu, then the first UBM layer 120a may be formed of a Cr and Cu compound to provide a better adhesive strength with the solder bump and the pad 105. Furthermore, the Cr and Cu compound layer may have a Cr concentration gradient, with a higher concentration of Cr near the pad 105.

The first and the second UBM layers 120a, 120b, respectively, may be formed simultaneously using a single material deposition technique. In this case, the first and the second UBM layers 120a, 120b may be fabricated from the same material. However, the invention is not limited in this regard since the first and the second UBM layers 120a, 120b, respectively, may be fabricated from different materials and/or using separate and distinct material deposition techniques.

It will be appreciated that the solder bump, the UBM layers 120a, 120b, and the pad 105 may be fabricated from numerous suitable materials, as is well known in this art. For example, the solder bump may be formed of Ti—Pd—Au, Ti—Ni—Au, a Pb-free material, or other suitable material layers. The thickness of the solder bump may be generally 0.5~1 μm, for example.

A second photoresist layer may be formed on the UBM layers 120a and 120b. The second photoresist layer may be exposed by a mask (e.g., the same mask used to form the first photoresist pattern 115 depicted in FIG. 6) to thereby form a second photoresist pattern 125. The second photoresist pattern 125 may expose the first UBM layer 120a in the opening 113. If the same mask is used to form both the first and the second photoresist patterns 115, 125, respectively, then the sidewall of the second photoresist pattern 125 may be formed in line with the sidewall of the first photoresist pattern 115. That is, the second photoresist pattern 125 may be aligned with the opening 113. A different mask may also be used to form the second photoresist pattern 125. In this case, the sidewall of the second photoresist pattern 125 may be disposed on the first UBM layer 120a, adjacent to the first photoresist pattern 115. Whether or not the same mask is used, the second photoresist pattern 125 may be formed to have an opening extended from the opening 113.

Figure 9:
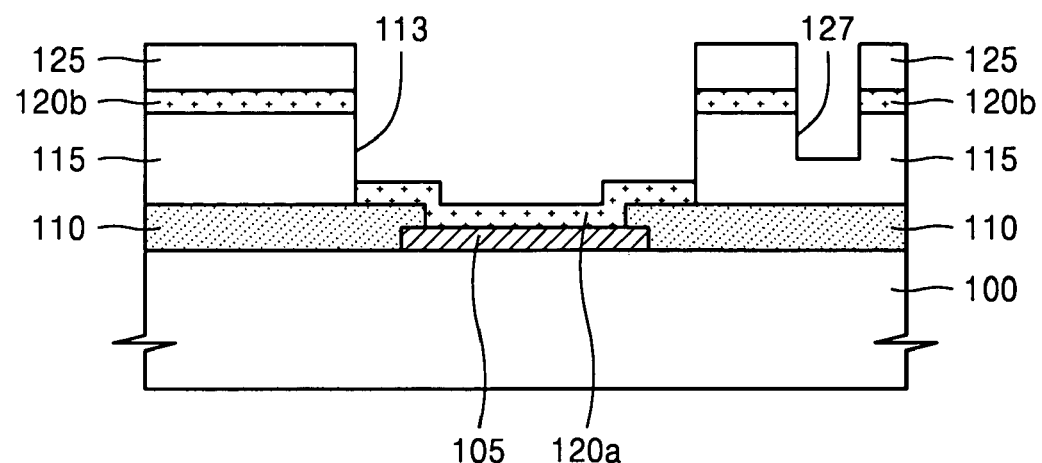

Referring to FIG. 9, a groove 127 may be formed in the second photoresist pattern 125, the second UBM layer 120b, and the first photoresist pattern 115. The groove 127 may be formed to facilitate the lift-off of the second UBM layer 120b. In this regard, a stripper may be provided in the groove 127. The stripper may penetrate into the first photoresist pattern 115 under the second UBM layer 120b. Subsequently, the second UBM layer 120b may be removed with the photoresist patterns 115 and 125.

The groove 127 may be formed by numerous and varied devices and techniques that are well known in this art. For example, a laser, a mechanical device (e.g., a saw for mechanically scribing the groove 127), and/or etching by photolithography may be implemented to form the groove 127. The groove 127 may have a sufficient depth to penetrate through the second UBM layer 120b and expose the first photoresist pattern 115.

As shown in FIG. 9, the groove 127 may be spaced apart and separate from the opening 113. Further, the groove 127 may be shaped so as to surround the opening 113. A groove that surrounds the opening 113 may facilitate an even penetration of the stripper into the first photoresist pattern 115.

It will be appreciated that that the invention is not limited to any particular groove shape. For example, the groove 127 may surround the opening 113 and have a ring shape, a non-circular shape, a triangle shape, a square shape, a rectangular shape, a spiral shape, or any other geometric shape. The groove 127 may also extend only partially around the opening 113. For example, the groove 127 may be in the form of a blind hole located to one side of the opening 113. Alternatively, a plurality of blind holes may be positioned around the circumference of the opening 113.

It will be appreciated that the invention is not limited to a specific cross-sectional shape of the groove 127. For example, the walls of the groove 127 could have cross sectional profiles that extend along straight lines, as shown in FIG. 9. The walls of the groove may also have cross sectional profiles that extend along curved lines; for example, the bottom wall of the groove 127 depicted in FIG. 9 could have a concave or convex shape. The cross section shape of the groove 127 may be symmetrical (as shown in FIG. 9) or asymmetrical. It will be appreciated that the depth of the groove 127 may be uniform or varied along the length of the groove 127.

Figure 10:
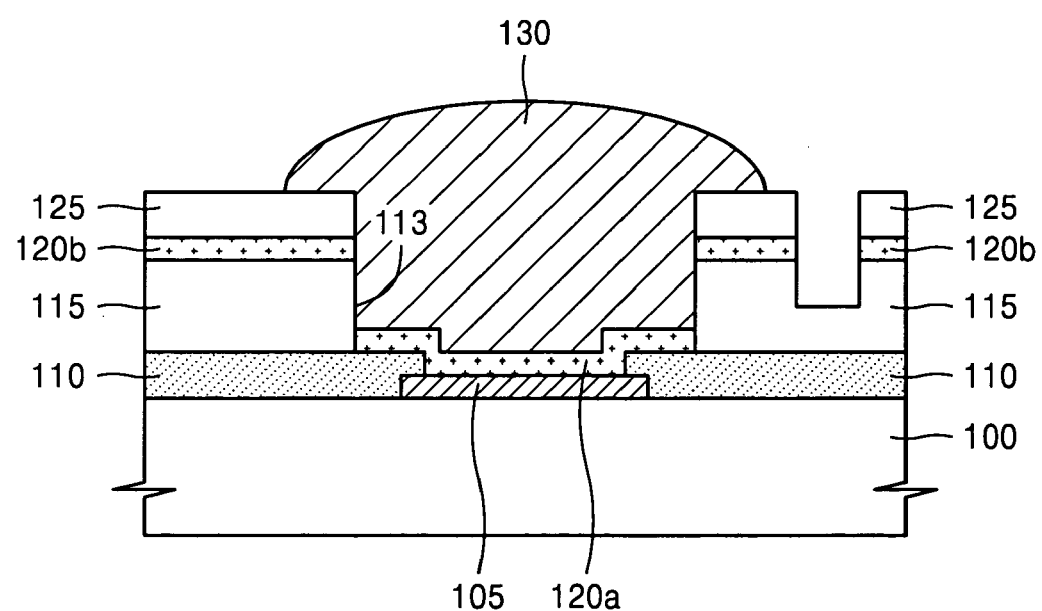

As shown in FIG. 10, the opening 113 may be filled with a solder layer to form a solder bump 130. The solder layer may be applied via an electroplating process, or some other suitable process that is well known in this art. The solder layer may be selected from the Pb—Sn family or another material family excluding Pb. For instance, the solder layer may be selected from an Sn family such as Sn, Sn—Cu, Sn—Ag, Sn—Bi or Sn—Ag—Cu, metals such as Au, Ni, or Cu, or other elements such as In, Bi, Sb, Zr, or Ag. Other materials may also be suitably employed as is well known in this art.

The second photoresist pattern 125 and the first photoresist pattern 115 may be removed by a stripper. The stripper may include an organic solvent such as acetone (for example). The stripper may penetrate the first photoresist pattern 115 through the groove 127. In this way, the first photoresist pattern 115 may be dissolved and the second UBM layer 120b may be removed by the lift-off method.

Figure 11:
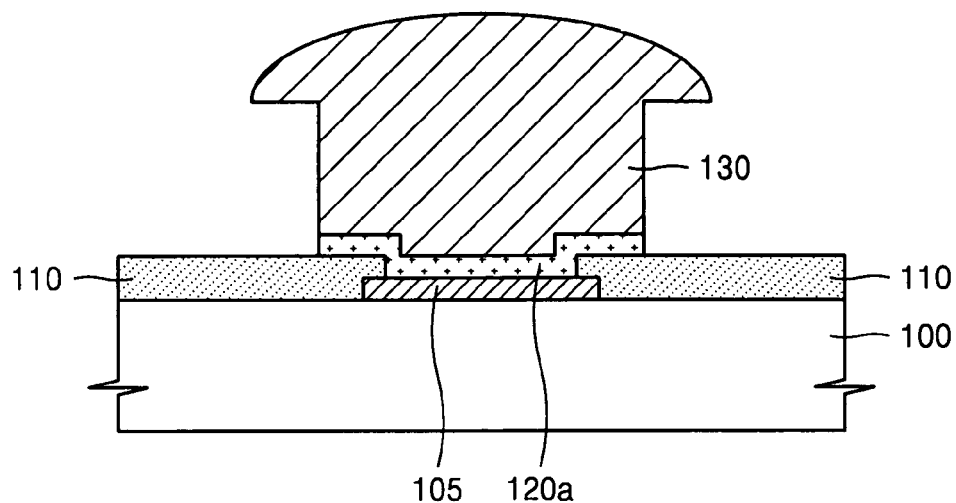

In this exemplary, non-limiting embodiment, the UBM layers 120a, 120b may not be etched using an etchant (as in the conventional method). Notwithstanding, the second UBM layer 120b may be effectively removed (via the lift-off method), and the first UBM layer 120a may remain below the solder bump 130, as shown in FIG. 11. FIG. 11 shows a structure after conducting the lift-off method. The solder bump 130 may be reflowed and cured so that the solder bump 130 may have a ball shape.

In this exemplary, non-limiting embodiment of the present invention, a chemical etchant containing an acid such as nitric acid, sulphuric acid, or hydrofluoric acid (for example) may not be used to remove the second UBM layer 220b via etching. As such, surface defects on the solder bump 130 may be reduced since the solder bump 130 may not react with etchant. Therefore, solder residue may not be generated. In addition, less UBM residue may remain because the second UBM layer 120b may be more completely removed (via the lift-off method) and surface defects may be reduced. Since the second UBM layer 120b may be removed by the lift-off method (instead of conventional etching techniques), poor solder bump quality and poor yield due to the UBM residue, reactions between an etchant and a solder bump surface, and solder residue may be reduced and/or altogether avoided.

FIGS. 12 through 18 are cross-sectional views illustrating a method of manufacturing a solder bump according to another exemplary, non-limiting embodiment of the present invention.

Figure 12:
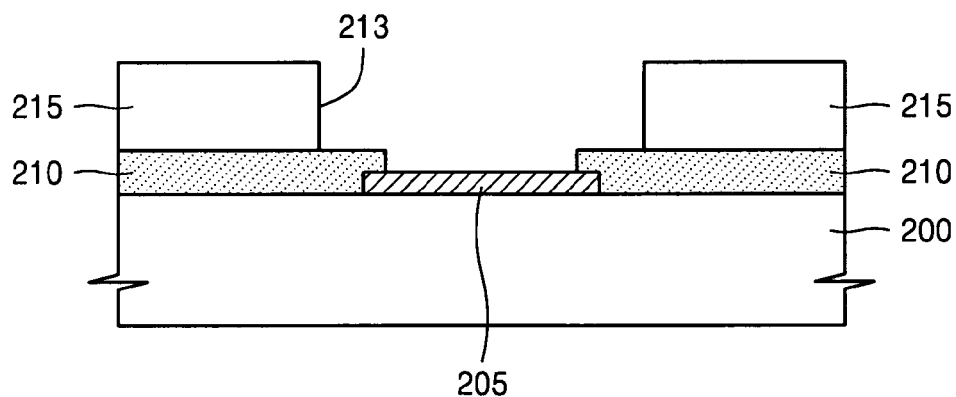
FIGS. 12 through 18 are cross-sectional views illustrating a method of manufacturing a solder bump according to another exemplary, non-limiting embodiment of the present invention.

In this exemplary embodiment, forming the passivation layer, the first photoresist pattern, and the UBM layers may be carried out as described above in the previous embodiment. That is, as illustrated in FIG. 12, a passivation layer 210 may be formed on a wafer 200. The passivation layer 210 may be patterned to expose a portion of a pad 205 on the wafer 200. A first photoresist pattern 215 may be formed on the passivation layer 210. The first photoresist pattern 215 may have a first opening 213 in a corresponding location to the pad 205.

Figure 13:
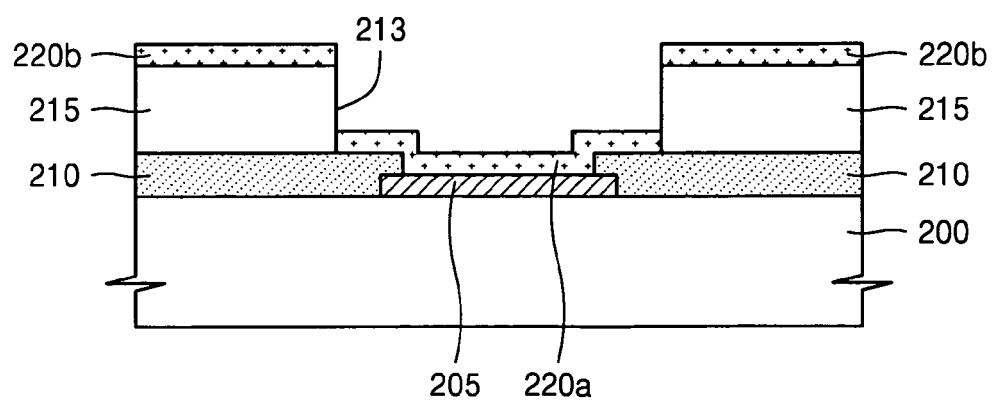

As shown in FIG. 13, a first UBM layer 220a and a second UBM layer 220b may be respectively formed inside and outside of the first opening 213. Details not specifically mentioned are described with reference to the previous embodiment.

Figure 14:
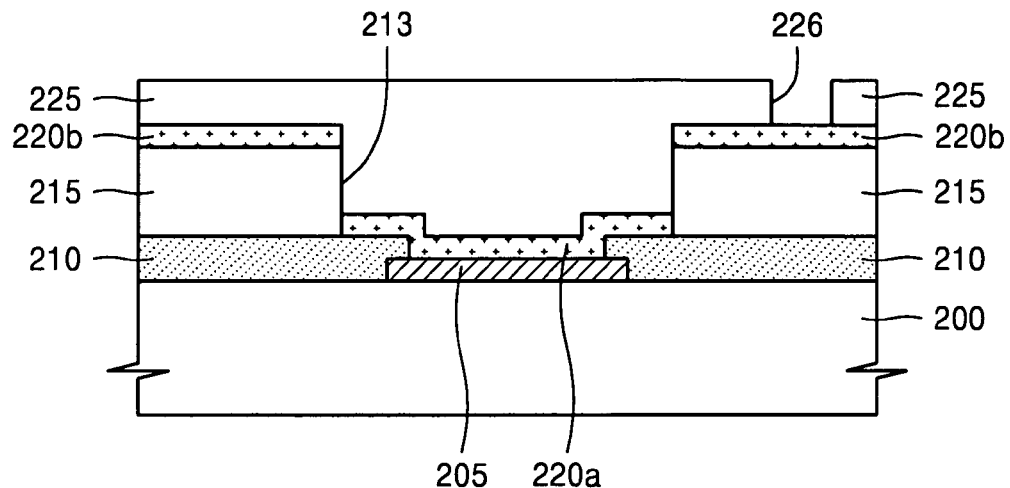

Referring to FIG. 14, a photoresist layer 225 may be formed over the UBM layers 220a and 220b by spin coating or some other suitable technique, as is well known in this art. The photoresist layer 225 may fill the opening 213. A second opening 226 may be formed in the photoresist layer 225 by exposing and developing the photoresist layer 225 so as to expose the second UBM layer 220b.

Figure 15:
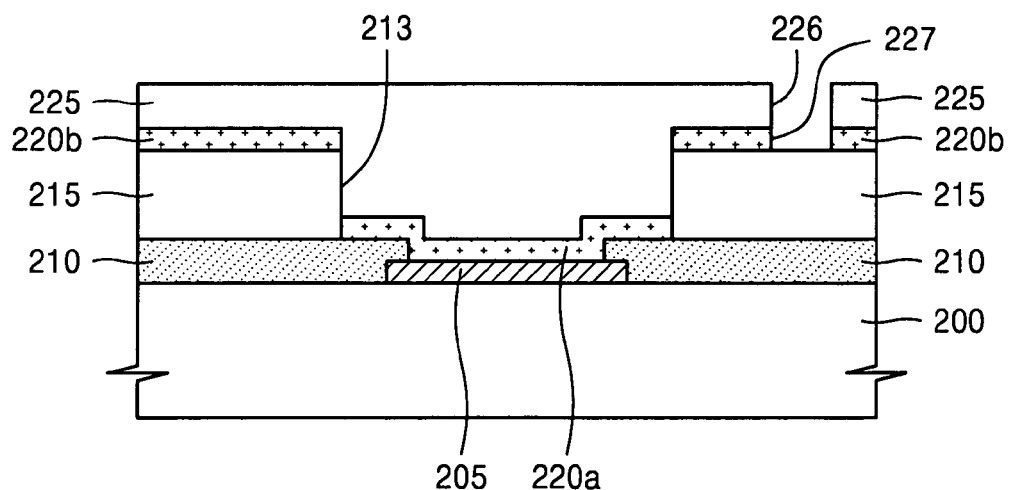

Referring to FIG. 15, a groove 227 may be formed in the second UBM layer 220b so that the first photoresist pattern 215 may be exposed through the second opening 226. The groove 227 may be formed by etching the second UBM layer 220b through the second opening 226. Although an etchant including acid may be used when etching the second UBM layer 220b, the etchant may not affect the solder bump. This is because the etchant may be used before the solder bump is even formed. Also, etching may be conducted to remove only a portion of the second UBM layer 220b, which is provided on the first photoresist pattern 215, and which is spaced apart from the passivation layer 210. Thus, the possibility of surface defects occurring on the wafer or on the solder bump may be reduced.

As shown in FIG. 15, the groove 227 may be spaced apart and separate from the opening 213. Further, the groove 227 may be shaped so as to surround the opening 213. A groove that surrounds the opening 213 may facilitate an even penetration of the stripper into the first photoresist pattern 215. It will be appreciated that the invention is not limited to any particular groove shape. The groove 227 may be formed to have numerous and varied shapes, as discussed above with respect to the groove 127 of the previous embodiment. The groove 227 having a desired shape may be formed by adequately adjusting a shape of the second opening 226.

Figure 16:
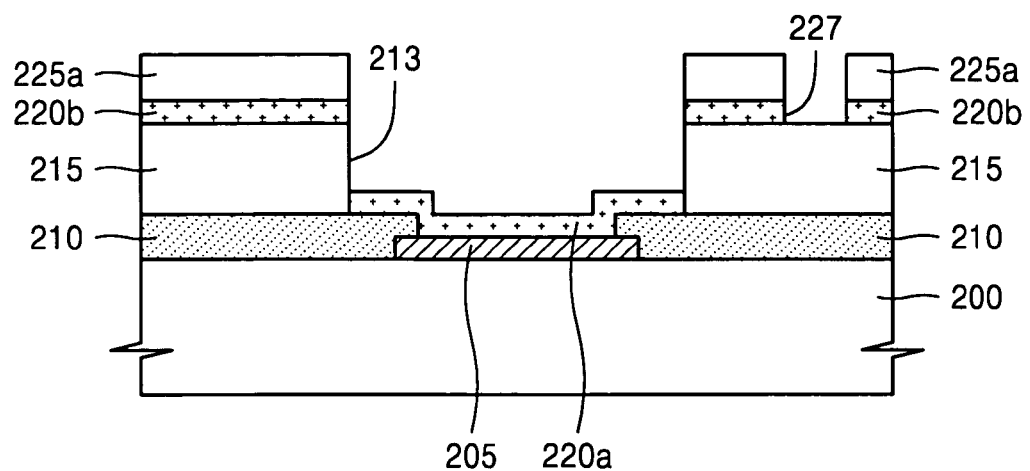

Referring to FIG. 16, a second photoresist pattern 225a, which does not have material in the opening 213, may be formed by exposing and developing the photoresist layer 225. Consequently, the first UBM layer 220a may be exposed through the second photoresist pattern 225a.

Figure 17:
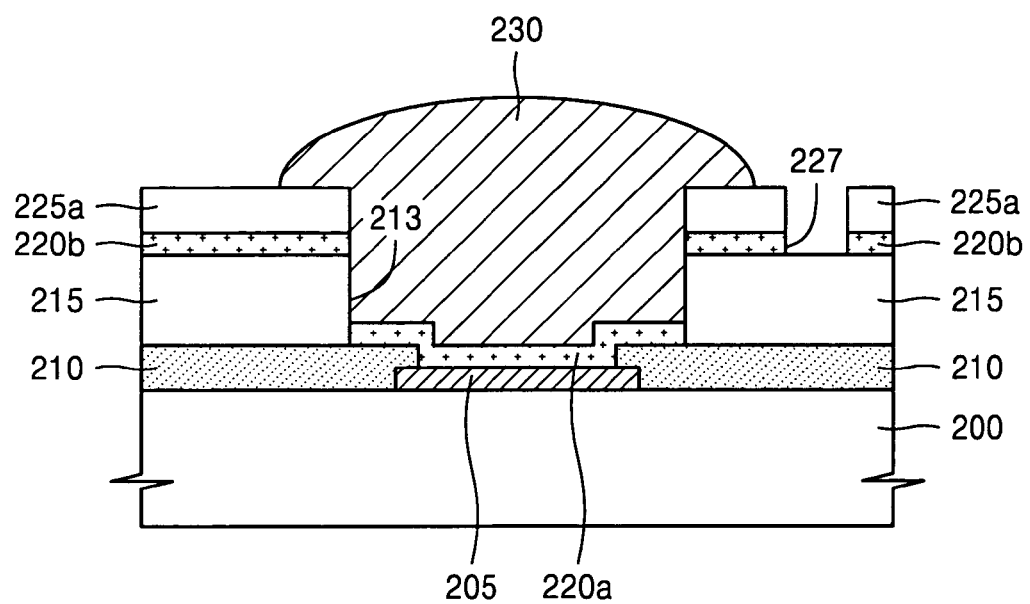

With reference to FIG. 17, the opening 213 may be filled with a solder layer to form a solder bump 230 on the first UBM layer 220a. The solder layer may be applied by electroplating, or some other suitable process that is well known in this art.

Figure 18:
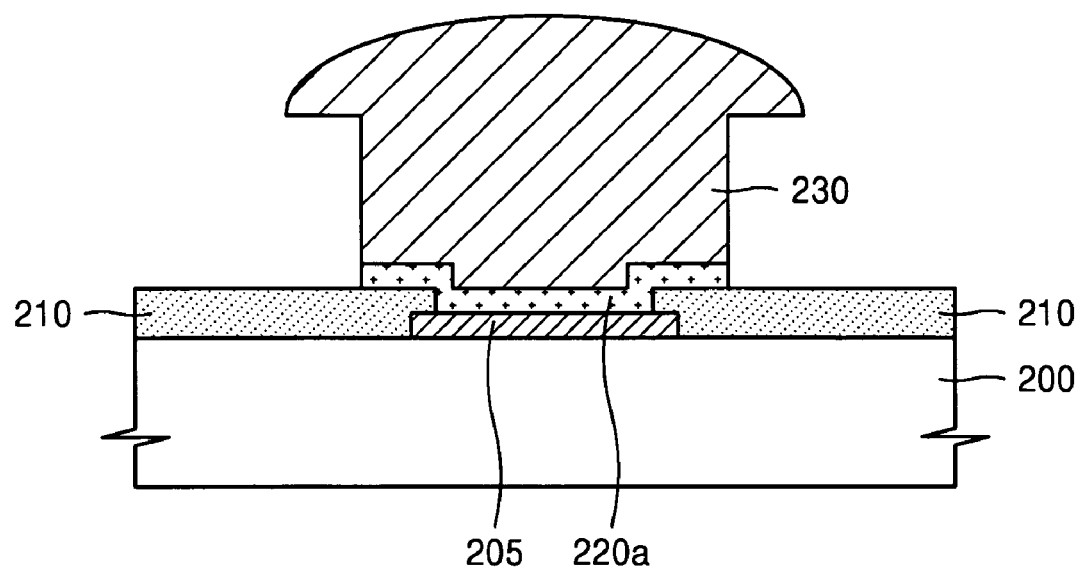

The first photoresist pattern 215 and the second photoresist pattern 225a may be dissolved by a stripper. At this time, the second UBM layer 220b may be removed since the stripper may penetrate into the first photoresist pattern 215 through the groove 227. In this way, the first UBM layer 220a may remain below the solder bump 230, as illustrated in FIG. 18. The solder bump 230 may be reflowed and cured so that the solder bump 230 may have a ball shape.

According to this exemplary, non-limiting embodiment of the present invention, a chemical etchant containing acid such as nitric acid, sulphuric acid, or hydrofluoric acid (for example) may be used in etching a part of the UBM layer before forming the solder bump 230. The solder bump 230 may not be exposed to the etchant, and thus surface defects in the solder bump 130 may be reduced. Most of the second UBM layer 220b may be removed altogether in the lift-off process, and thus, solder residue may not be generated.

As described above, although a chemical etchant containing acid may not be used, the UBM layer may remain below the solder bump only. In addition, even when the chemical etchant is used, it may be used before the solder bump is even formed. Thus, surface defects on the solder bump may be reduced since the solder bump may not be contacted by the etchant. Therefore, a solder residue may not be generated.

Moreover, little UBM residue may be formed because the second UBM layers 120b and 220b may be more completely removed, and surface defects may be reduced. When the second UBM layers 120b and 220b are removed by the lift-off method (instead of the conventional etching method), problems of declined bump quality, yield and/or electrical shorts due to UBM residue, bump surface reactions with the etchant, and solder residue may be solved. Thus, a bump with better quality may be formed and the reliability of the chip and/or yield may be increased.

In the exemplary, non-limiting embodiments of the present invention, a UBM layer may be removed by a lift-off process, while in the prior art, the UBM layer may be removed via an etching process. In the exemplary embodiments of the present invention, the manufacturing process may be simplified and costs may be lowered (as compared to conventional etching techniques).

While exemplary embodiments of the present invention have been particularly shown and described, it will be understood by those of ordinary skill in the art that various changes in form and details may be made therein without departing from the spirit and scope of the present invention as defined by the following claims.

What is claimed is:

1. A method of forming a solder bump, the method comprising:
    forming a first photoresist pattern on a wafer having a pad, the first photoresist pattern having an opening that exposes a portion of the pad;
    forming a first under bump metallurgy (UBM) layer on the pad;
    forming a second UBM layer on the first photoresist pattern, the second UBM layer being spaced apart from the first UBM layer;
    forming a second photoresist pattern that exposes the first UBM layer and covers the second UBM layer;
    forming a solder bump in the opening; and
    removing the second photoresist pattern and the first photoresist pattern using a stripper, thereby removing the second UBM layer by a lift-off method.

2. The method of claim 1 further comprising sequentially etching the second photoresist pattern, the second UBM layer, and the first photoresist pattern, thereby forming a groove in the second photoresist pattern, the second UBM layer and the first photoresist pattern.

3. The method of claim 1 further comprising sequentially laser-cutting the second photoresist pattern, the second UBM layer, and the first photoresist pattern, thereby forming a groove in the second photoresist pattern, the second UBM layer, and the first photoresist pattern.

4. The method of claim 1 further comprising sequentially mechanically scribing the second photoresist pattern, the second UBM layer, and the first photoresist pattern, thereby forming a groove in the second photoresist pattern, the second UBM layer, and the first photoresist pattern.

5. The method of claim 1, wherein forming the second photoresist pattern comprises:
   forming a photoresist layer over the first and the second UBM layers; and
   removing a portion of the photoresist layer disposed on the first UBM layer by using an exposing and developing process.

6. The method of claim 1, wherein forming the second photoresist pattern comprises:
   forming a photoresist layer over the first and the second UBM layers;
   forming a groove so as to expose the second UBM layer by performing a first exposing and developing process;
   etching the second UBM layer exposed by the groove; and
   removing a portion of the photoresist layer disposed on the first UBM layer to form an opening by performing a second exposing and developing process.

7. A method of forming a bump, the method comprising:
   forming a passivation layer on a wafer having a pad, the passivation layer being formed such that the passivation layer exposes a portion of the pad;
   forming a first photoresist pattern on the passivation layer having an opening to expose the pad;
   forming a first under bump metallurgy (UBM) layer on the pad;
   forming a second UBM layer on the first photoresist pattern;
   forming a second photoresist pattern that exposes the first UBM layer and covers the second UBM layer;
   forming a groove by removing a portion of the second photoresist pattern, the second UBM layer, and the first photoresist pattern;
   forming a solder bump in the opening; and
   applying a stripper in the groove to remove the second photoresist pattern and the first photoresist pattern, thereby removing the second UBM layer by a lift-off method.

8. The method of claim 7, wherein the groove is spaced apart and separate from the opening.

9. The method of claim 7, wherein the groove surrounds the opening.

10. The method of claim 7, wherein the opening exposes the pad and the passivation layer in the vicinity of the pad.

11. The method of claim 10, wherein the first UBM layer is adjacent to the first photoresist pattern and the passivation layer.

12. A method of forming a solder bump, the method comprising:
   forming a solder bump in an opening extending through a first photoresist pattern provided on a wafer, an under bump metallurgy (UBM) layer provided on the first photoresist pattern, and a second photoresist pattern provided on the UBM layer;
   forming a groove that extends through the second photoresist pattern and the UBM layer; and
   applying a stripper in the groove to remove the second photoresist pattern and the first photoresist pattern, thereby removing the UBM layer by a lift-off method.

13. The method of claim 12, wherein the groove is spaced apart from the opening.

14. The method of claim 12, wherein the groove surrounds the opening.

15. A method of forming a solder bump, the method comprising:
   a) forming a solder bump on a first under bump metallurgy (UBM) layer in an opening extending through a first photoresist pattern provided on a wafer, a second UBM layer provided on the first photoresist pattern, and a second photoresist pattern provided on the second UBM layer, the second UBM layer being spaced apart from the first UBM layer; and
   b) applying a stripper to remove the second photoresist pattern and the first photoresist pattern, thereby removing the UBM layer by a lift-off method;
   wherein a) and b) are performed in sequential order.

* * * * *